United States Patent [19]

Bill

[11] Patent Number: 4,533,975
[45] Date of Patent: Aug. 6, 1985

[54] RADIATION HARDENABLE COATING AND ELECTRONIC COMPONENTS COATED THEREWITH

[75] Inventor: Jacob C. Bill, Columbia, S.C.

[73] Assignee: North American Philips Corporation, New York, N.Y.

[21] Appl. No.: 565,685

[22] Filed: Dec. 27, 1983

[51] Int. Cl.$^3$ .................. H01G 4/08; H01G 4/18; C08F 2/46; B05D 1/00

[52] U.S. Cl. .................. 361/323; 174/52 PE; 204/159.23; 361/315; 523/437; 523/458; 524/435

[58] Field of Search .............. 204/159.23; 174/52 PE; 361/323, 315

[56] References Cited

U.S. PATENT DOCUMENTS

| | | | |
|---|---|---|---|
| 3,876,518 | 4/1975 | Borden et al. | 204/159.19 |
| 3,915,824 | 10/1975 | McGinniss | 204/159.19 |
| 4,040,925 | 8/1977 | McGinniss | 204/159.23 |
| 4,122,211 | 10/1978 | Kiguga et al. | 174/52 PE |
| 4,143,013 | 3/1979 | Jenkinson et al. | 204/159.23 |
| 4,282,269 | 8/1981 | Lucey | 204/159.23 |
| 4,414,173 | 11/1983 | Cobbledick et al. | 428/413 |
| 4,416,750 | 11/1983 | Murphy et al. | 204/159.19 |
| 4,457,766 | 7/1984 | Caul | 427/44 |

Primary Examiner—Herbert J. Lilling
Attorney, Agent, or Firm—Norman N. Spain

[57] ABSTRACT

An ultraviolet curable coating composition particularly adapted for providing water impermeable abrasive resistant coatings on low temperature degradable electronic components comprising a liquid mixture of an acrylated cresol novolac epoxy oligomer, a multifunctional acrylated urethane oligomer, a hydroxyalkyl methacrylate monomer, a bicyclic monofunctional acrylate monomer, a photoinitiator and a calcined cobalt alumina pigment.

7 Claims, 1 Drawing Figure

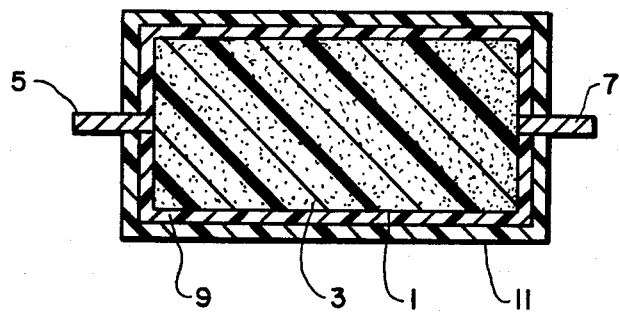

RADIATION HARDENABLE COATING AND ELECTRONIC COMPONENTS COATED THEREWITH

BACKGROUND OF THE INVENTION

This invention relates to an ultraviolet radiation curable liquid composition particularly adapted for the formation of protective coating on heat degradable electronic components. In particular, this invention relates to an ultraviolet hardenable resin composition particularly adapted for providing a protective coating on heat sensitive axial leaded or radial leaded film/foil or metallized capacitors and to the resultant coated capacitors.

In order to protect electronic components from various harmful aspects of the environment such as dirt, moisture, extremes in temperature, shock, abrasion and printed circuit cleaning solvents, it has long been the practice to protect these components with various hardened coating compositions. When the ingredients of the electronic component are such that they are not degradable at low temperatures, it has subsequently been found satisfactory to apply a heat hardenable resin composition. In many cases, however, the composition of the electronic component are such that they are degradable at relatively low temperatures frequently below the temperatures employed in hardening the heat hardenable resin compositions and wave soldering. In such cases, ultraviolet radiation curable compositions have frequently been employed. While ultraviolet radiation curable compositions have been found to be useful for many electronic components, it has been found that the heat of reaction is in some cases in excess of the degradation temperature of the component. This has been found particularly true when the component contains such materials as polystyrene or polypropylene. Thus, there is a need for a rapid curing low temperature U.V. curable coating composition for axial or radial leaded film/foil or metallized capacitors containing polypropylene or polystyrene film.

SUMMARY OF THE INVENTION

It is the object of this invention is to provide a low temperature degradable electronic component with a protective coating hardenable at a temperature below the degradable temperature of the component.

Another object of this invention is to provide a low temperature hardenable composition for electric components that may be rapidly and readily be applied to said components. These and other objects of the invention will be apparent from the description that follows.

According to the invention, the applicant has prepared a new and novel ultraviolet radiation curable liquid coating composition particularly adapted for forming a shock resistant, moisture impermeable, abrasive resistant printed circuit solvent resistant coating on axial or radial leaded metallized or film/foil capacitors comprising polypropylene or polystyrene film.

The ultraviolet radiation curable liquid coating composition of the invention comprises a liquid mixture of an acrylated epoxy oligomer, a multifunctional urethane oligomer, a hydroxyalkyl methacrylate monomer, an aliphatic bicyclic monofunctional acrylate monomer, a calcined cobalt alumina pigment and at least one thermal and one U.V. free radical initiator. It was found, quite unexpectedly, that the addition of the calcined cobalt alumina pigment not only provided a blue color to the hardened coating but aided in the acceleration of the hardening reaction.

The novel liquid curable composition of the invention has been found to be particularly useful for providing hardened, abrasive resistant, moisture impermeable solvent resistant coatings on electronic components at temperatures below 80° C. particularly on axial leaded polypropylene or polystyrene film/foil or metallized capacitors.

The coating compositions of the invention when applied in layers of from 10-12 mils. were found, within 1 to 5 seconds, to have hardened to abrasive resistant, water impermeable, solvent resistant coatings when exposed to ultraviolet radiation with the temperature of the coating compositions being raised by the heat of reaction below the melt point of polystyrene film (i.e. 105° C.).

If it is desired to prevent foaming which may produce undesirable bubbles in the resultant product an antifoaming agent may be added to the curable composition.

If bubble control is desired, an antifoaming agent such as a polyalkylsiloxane polymer may be added.

Coatings of the invention may be applied to the component by methods well known in the art, for example, by dipping, spraying or rolling.

Another advantage of the coating compositions of the invention is that not only are they curable by ultraviolet radiation but they are also heat curable at temperatures below 80° C. This feature is of importance particularly when, due to shadowing, total ultraviolet curing of a section of a coated device is not possible.

GENERAL DESCRIPTION OF THE DRAWING

The sole FIGURE in the drawing is a cross-sectional view of an axial leaded film/foil polystyrene film capacitor coated with the composition of the invention.

DESCRIPTION OF THE PREFERRED EMBODIMENT

While the curable coating compositions of the invention are usable for use on electronic components containing ingredients degradable at temperatures below 105° C. or less such as polypropylene and polystyrene they are particularly useful for coating electronic components containing polystyrene which is performance degradable at about 80° C. The coating of the invention may be applied either as a single or as a multiple coating.

The invention will now be described in greater detail with reference to the following example.

EXAMPLE

A liquid coating composition of the following composition was prepared:

| | | |
|---|---|---|
| isobornyl acrylate | 10 grams | ±1% |
| hydroxypropyl methacrylate | 10 grams | ±1% |
| Uvithane 788 (an acrylated urethane oligomer sold by Thiokol Specialty Chemicals Division | 23 grams | ±1% |
| Celrad 3700 (a diacrylate ester of a bisphenol epoxy resin sold by Celanse Plastic and Specialty Company) | 57 grams | ±1% |
| Lupersol 256 (a diperoxy ester organic peroxide sold by Penwalt Corporation) | 3 grams | ±1% |
| Irgacure 651 - (a pH photoinitiator sold by Ciba) | 5 grams | ±1% |

| -continued | | |
|---|---|---|
| Ferro V-3285 Dark Blue Inorganic Pigment (a calcined cobalt alumina pigment sold by Ferro Corporation Color Division) | 0.25 grams | ±1% |
| Corning 200 Fluid (a medium viscosity linear polydimethyl siloxane antifoaming agent sold by Dow Corning Corporation) | .10 grams. | ±1% |

A thin liquid coating of a thickness of about 12–15 mils. of this liquid coating composition was applied by roller coating to the surface 1 of a film/foil polystyrene film capacitor 3 supplied with axial leads 5 and 7 was then exposed to a source of ultraviolet radiation of an intensity of 200 watts per inch and cured to hardness within a period of 2 to 4 seconds. To the resultant hardened coating 9 a second coating 11 of a similar thickness was applied employing the same process. This second coating was also exposed to a ultraviolet lamp at an intensity of 200 watts per inch and curing was achieved in about 2 to 4 seconds. After the formation of this second hardened coating 11 the capacitor was then postcured by being exposed by being heated at a temperature of 70°–80° C. for 2½ hours. As a result, the capacitor was supplied with a hard, abrasive resistant, water impermeable, solvent resistant coating. Tests carried out on the film/foil polystyrene film capacitors coated by the method of the invention and uncoated metallized polystyrene film capacitors showed that the capacitors coated with the coating of the invention exhibited no degregation of properties while being adequately protected against cleaning solvents, abrasion and moisture.

Additionally, this temperature sensitive part can now be auto inserted and wave soldered making it a viable component for high production mechanization.

What is claimed is:

1. An ultraviolet radiation curable liquid coating composition particularly adapted for providing a low temperature degradable electronic component with a protective coating, said composition comprising a liquid mixture of an acrylated epoxy oligomer, an acrylated urethane oligomer, a hydroxyalkyl methacrylate monomer, an aliphatic bicyclic monofunctional monomer, a calcined cobalt alumina pigment and at least one U.V. free radical initiator and one thermal free radical initiator.

2. The liquid coating composition of claim 1, wherein in addition an antifoaming agent is present.

3. An electronic component having an ultraviolet radiation cured coating formed from the coating composition of claim 1.

4. An electronic component having an ultraviolet radiation cured coating formed from the coating composition of claim 2.

5. A film capacitor having an ultraviolet radiation cured coating formed from the coating composition of claim 2.

6. An axial leaded polystyrene film capacitor having an ultraviolet radiation cured coating formed from the coating composition of claim 1.

7. An axial leaded polystyrene film capacitor having an ultraviolet radiation cured coating formed from the coating composition of claim 2.

* * * * *